(12) United States Patent
Takizawa

(10) Patent No.: US 12,148,497 B2
(45) Date of Patent: Nov. 19, 2024

(54) SEMICONDUCTOR MEMORY DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Tetsuro Takizawa, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 150 days.

(21) Appl. No.: 17/898,576

(22) Filed: Aug. 30, 2022

(65) Prior Publication Data
US 2023/0178170 A1 Jun. 8, 2023

(30) Foreign Application Priority Data
Dec. 6, 2021 (JP) ................. 2021-197760

(51) Int. Cl.
*G11C 29/52* (2006.01)
*G11C 13/00* (2006.01)
*G11C 29/00* (2006.01)
*G11C 29/20* (2006.01)
*G11C 29/04* (2006.01)

(52) U.S. Cl.
CPC .......... *G11C 29/52* (2013.01); *G11C 13/0033* (2013.01); *G11C 29/20* (2013.01); *G11C 29/783* (2013.01); *G11C 2029/0411* (2013.01); *G11C 2207/06* (2013.01); *G11C 2211/4062* (2013.01)

(58) Field of Classification Search
CPC ..... G11C 29/52; G11C 13/0033; G11C 29/20; G11C 29/783; G11C 2029/0411; G11C 2207/06; G11C 2211/4062; G11C 29/42
See application file for complete search history.

(56) References Cited

U.S. PATENT DOCUMENTS

2017/0161142 A1* 6/2017 Reed ................. G06F 11/1068
2021/0005276 A1 1/2021 Nakaoka

FOREIGN PATENT DOCUMENTS

JP 2020-71589 A 5/2020

* cited by examiner

*Primary Examiner* — Jay W. Radke
(74) *Attorney, Agent, or Firm* — Posz Law Group, PLC

(57) ABSTRACT

A semiconductor memory device includes: a plurality of banks having a data storage unit and an error correction code storage unit; an error correction code generation unit; an error correction unit; a row counter that determines a row address as a refresh target; a bank counter that determines a bank address as an error correction target; and a column counter that determines a column address as the error correction target. The error correction unit performs the error correction process on a data of an error correction target address determined based on the row counter, the bank counter, and the column counter when receiving a refresh command.

3 Claims, 10 Drawing Sheets

SEMICONDUCTOR MEMORY DEVICE

CROSS REFERENCE TO RELATED APPLICATIONS

The present application claims the benefit of priority from Japanese Patent Application No. 2021-197760 filed on Dec. 6, 2021. The entire disclosure of the above application is incorporated herein by reference.

TECHNICAL FIELD

The present disclosure relates to a semiconductor memory device.

BACKGROUND

As the semiconductor memory device, for example, a DRAM (Dynamic Random Access Memory) having an ECC (Error Check and Correct) function and autonomously performing data error correction process may be used. However, in such an ECC-compatible DRAM, error correction is performed only on the data read upon receiving a request from SoC (System On a Chip) or the like, and the corrected read data is not written back to the DRAM, so that an error remains inside the DRAM.

In the semiconductor memory device of a conceivable technique, an error correction process is performed when the semiconductor memory device is refreshed, and the data after the error correction is written back to the semiconductor memory device, thereby reducing the error in the semiconductor memory device and reduction of reliability of the data is suppressed.

SUMMARY

According to an example, a semiconductor memory device includes: a plurality of banks having a data storage unit and an error correction code storage unit; an error correction code generation unit; an error correction unit; a row counter that determines a row address as a refresh target; a bank counter that determines a bank address as an error correction target; and a column counter that determines a column address as the error correction target. The error correction unit performs the error correction process on data of an error correction target address determined based on the row counter, the bank counter, and the column counter when receiving a refresh command.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Some semiconductor memory devices have a plurality of data storage areas (hereinafter, also referred to as "banks") to suppress performance deterioration. However, the conceivable technique does not describe refreshing and error correction processing when the semiconductor memory device includes a plurality of banks. Therefore, in the conceivable technique, specifically, there is no description for corresponding to both features that refresh and error correction process is performed for all of a plurality of banks, and refresh and error correction process is performed for only a specified part of the plurality of banks. As described above, conventionally, the refresh and error correction process in the semiconductor memory device including a plurality of banks has not been sufficiently studied, and there is room for improvement.

The present embodiments can be realized as the following embodiments.

According to one embodiment of the present embodiments, a semiconductor memory device is provided. The semiconductor memory device is a semiconductor memory device having a refresh function, and the semiconductor memory device includes: a plurality of banks having a data storage unit that stores data and an error correction code storage unit that stores an error correction code corresponding to the data stored in the data storage unit; an error correction code generation unit that generates an error correction code; an error correction unit that performs an error correction process of data using the error correction code; a row counter that determines a row address as a refresh target; a bank counter that determines a bank address as an error correction target; and a column counter that determines a column address as the error correction target, wherein: the error correction unit performs the error correction process on data of an error correction target address determined based on the row counter, the bank counter, and the column counter when receiving a refresh command.

According to this feature of the semiconductor memory device, the semiconductor memory device includes a plurality of banks, and the error correction unit performs the error correction process on data of an error correction target address determined based on the row counter, the bank counter, and the column counter when receiving a refresh command. Thus, it is possible to suppress the deterioration of the reliability of the data in the semiconductor memory device provided with a plurality of banks.

A. Embodiments

Figure 1:
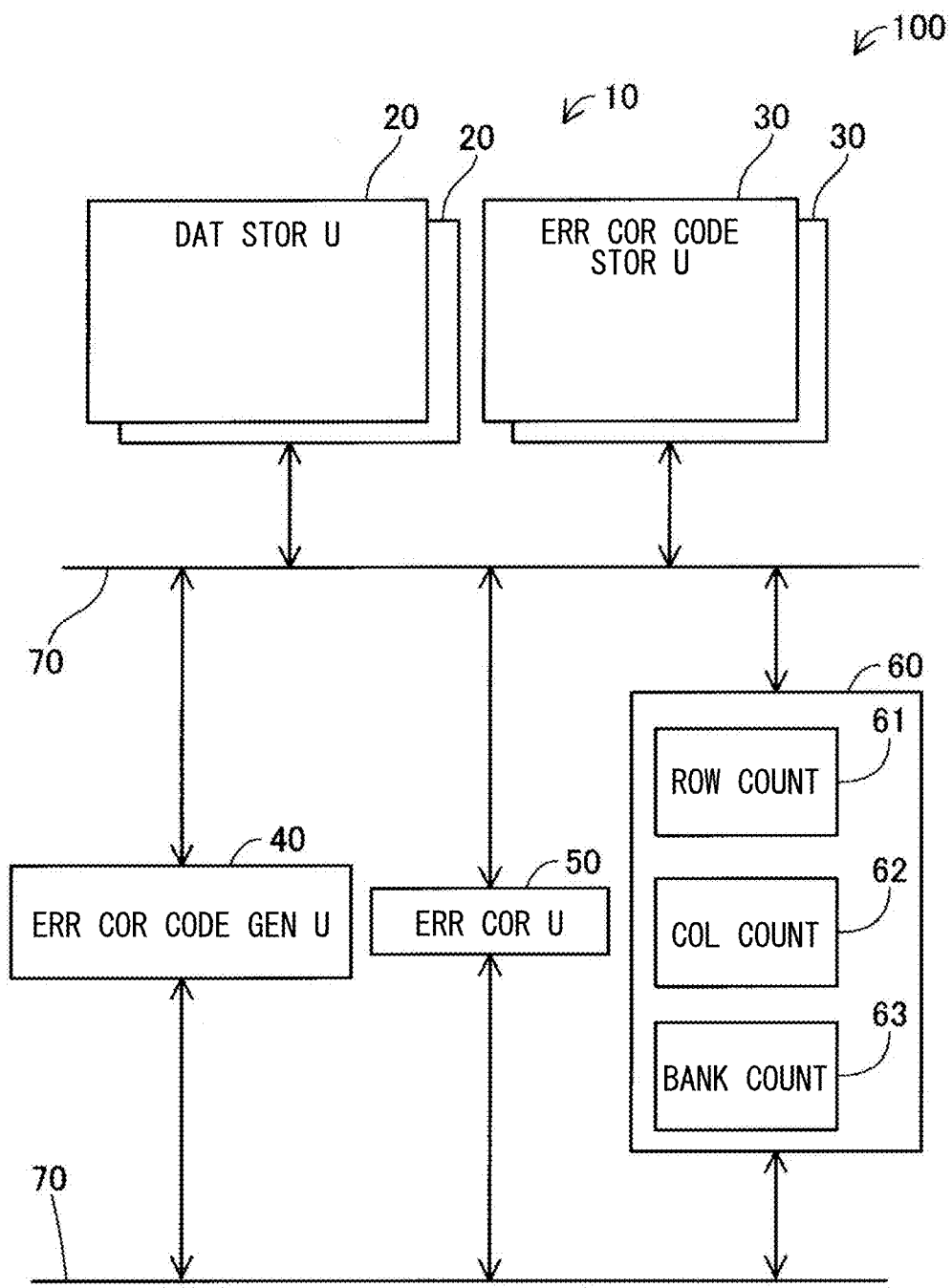
FIG. 1 is an explanatory diagram schematically showing the configuration of the semiconductor memory device of the present embodiment.

As shown in FIG. 1, the semiconductor memory device 100 of the present embodiment includes a plurality of banks 10, an error correction code generation unit 40, an error correction unit 50, and a counter 60. In the present embodiment, each functional unit may be provided by hardware and is connected to each other via a bus 70. The semiconductor memory device 100 is, for example, a DRAM, and reads and writes data in response to a request received from an external device such as a SOC. Further, the semiconductor memory device 100 has a refresh function and autonomously restores data. Further, the semiconductor memory device 100 performs an error correction process for all banks 10 at the time of refresh execution.

The plurality of banks 10 include a data storage unit 20 and an error correction code storage unit 30. The data storage unit 20 holds data to be read/written in response to a request received from an external device. The error correction code storage unit 30 holds an error correction code generated by the error correction code generation unit 40 according to the input data. In the present embodiment, the data storage unit 20 and the error correction code storage unit 30 are configured by different banks.

Figure 2:
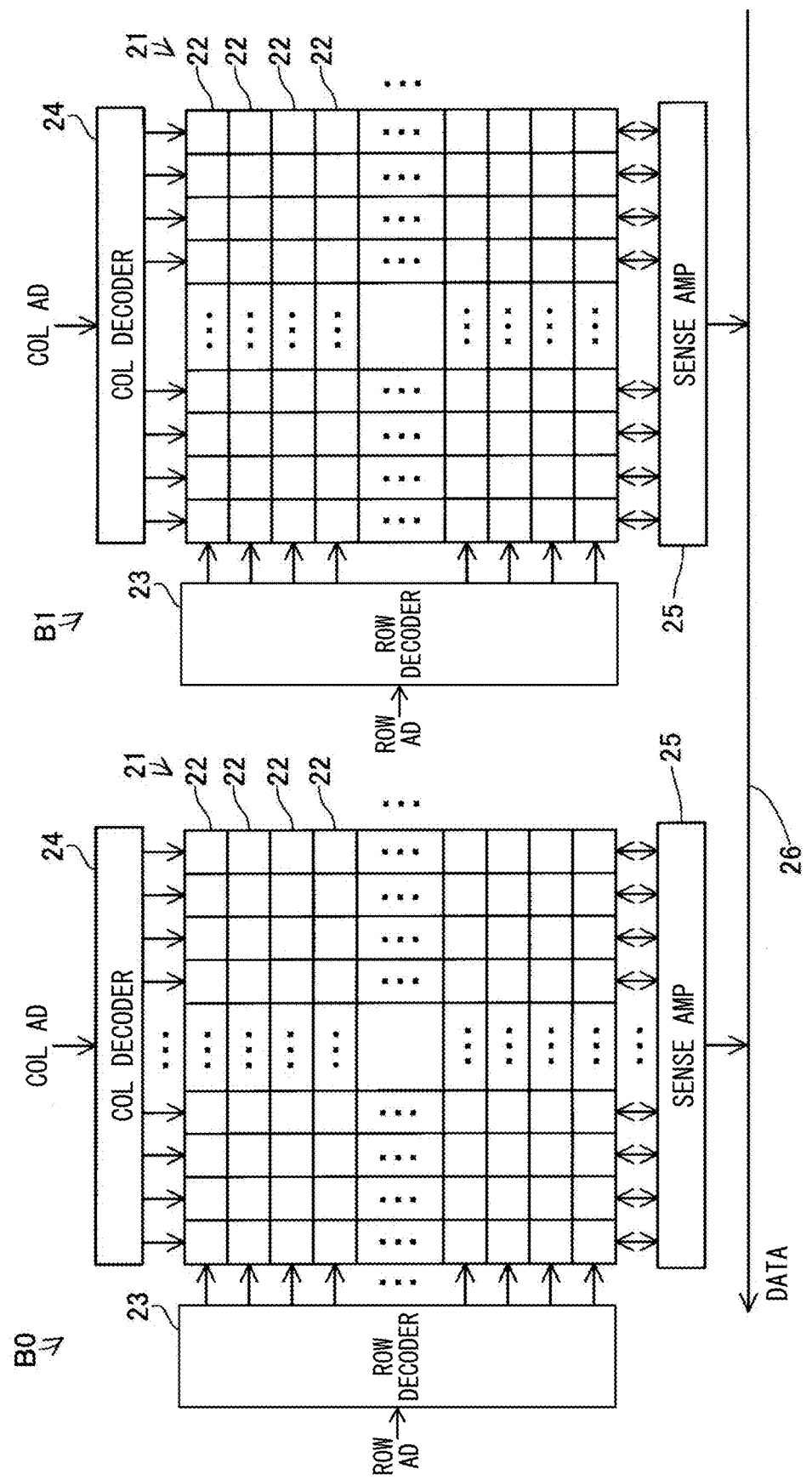
FIG. 2 is an explanatory diagram schematically showing the configuration of a data storage unit.

As shown in FIG. 2, in the present embodiment, the data storage unit 20 includes a bank B0 and a bank B1. The bank B0 and bank B1 each include a memory cell array 21, a row decoder 23, a column decoder 24, and a sense amplifier 25, respectively.

The banks B0 and B1 are connected to the bus 26, and data is read/written to/from the semiconductor memory device 100 by an external device via the bus 26. The data is read/written to/from the memory cell array 21 via the sense amplifier 25. The bus 26 is connected to the bus 70 shown in FIG. 1.

The configuration of the memory cell array 21 is the same as that of a typical DRAM. More specifically, the memory cell array 21 is formed by arranging a plurality of memory cells 22 of a 1-transistor 1-capacitor type in a matrix. A word line and a bit line (not shown) are connected to each memory cell 22.

The row decoder 23 activates any one of the plurality of word lines in the memory cell array 21 according to the row address. The column decoder 24 activates any one of the plurality of bit lines in the memory cell array 21 according to the column address. In this way, the memory cell 22 as an access target is selected by the combination of the word line and the bit line activated by the row decoder 23 and the column decoder 24.

When data is written to the data storage unit 20, the error correction code generation unit 40 of FIG. 1 generates an error correction code according to the written data. For example, a Huffman code can be used as the error correction code.

The error correction unit 50 corrects the error in the data read by the sense amplifier 25 using the error correction code read from the error correction code storage unit 30 when the data is read from the data storage unit 20 to the external device and also when refreshing is performed. For example, by performing error correction process using the Huffman code as described above, it is possible to correct a 1-bit error in the read data.

The counter 60 includes a row counter 61, a column counter 62, and a bank counter 63. The counter 60 performs a predetermined counting operation, and the address of the data to be accessed is determined according to the counter value indicated by the counter 60. The counting operation of the counter 60 will be described later.

The refreshing and error correction process of this embodiment will be described. In the present embodiment, the semiconductor memory device 100 performs the refreshing and error correction process when receiving either an ALL Bank Refresh (hereinafter, also referred to as "ABR") command or a Per Bank Refresh (hereinafter, also referred to as "PBR") command issued from an external device. The external device transmits either an ABR command or a PBR command to the semiconductor memory device 100 to instruct the execution of refresh and error correction process regardless of the processing status of the semiconductor memory device 100. The ABR command and the PBR command are issued on a page by page basis. The page means a memory cell 22 that belongs to a common row address in a certain bank.

The ABR process shown in FIG. 3 will be described. The ABR process is a process for performing the refresh and error correction process for all banks among the plurality of banks 10. In the present embodiment, the semiconductor memory device 100 executes the ABR process when it receives an ABR command issued from an external device. The ABR command corresponds to the "first refresh command" in the present embodiment.

In the ABR process, all of the plurality of banks 10 are designated as refresh target banks (at step S110). The refresh target bank means a bank on which refresh is executed.

In step S120, the semiconductor memory device 100 determines the refresh target page, the error correction target bank, and the error correction target memory cell based on the row counter value Cr, the bank counter value Cb, and the column counter value Cc at the time of issuing the ABR command. The refresh target page means a page on which refresh is executed among the refresh target banks, and is specified by a row address defined by the row counter 61. The error correction target bank means a bank in which error correction is executed, and is specified by a bank address defined by a bank counter 63. The error correction target memory cell means the memory cell 22 in which the error correction is executed in the error correction target bank, and is specified by the column address defined by the column counter 62. The error correction target bank and the error correction target memory cell correspond to the "error correction target address" in the present embodiment. The time when the ABR command is issued may not be limited to the time when the ABR command is issued, but also includes, for example, the timing when the semiconductor memory device 100 receives the ABR command.

In step S130, the semiconductor memory device 100 performs the refresh and error correction process. The detailed procedure of the refresh and error correction process will be described with reference to FIG. 4.

Figure 4:
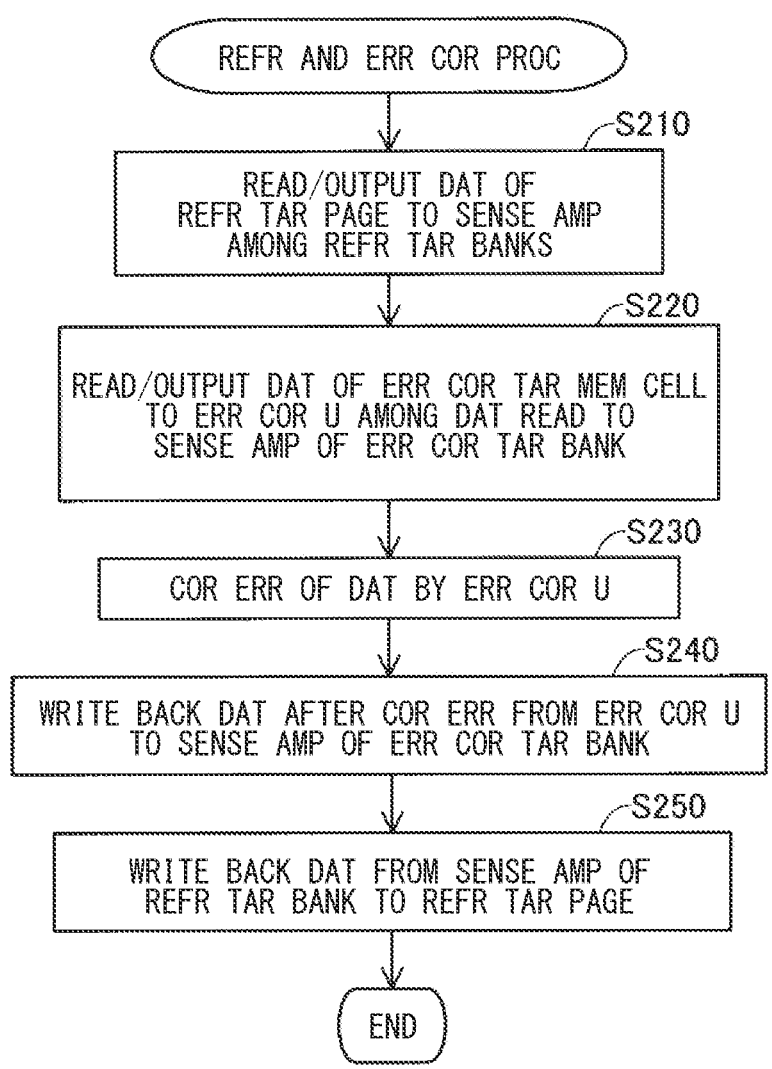
FIG. 4 is a flowchart showing a refresh and error correction process.

In step S210 of FIG. 4, the semiconductor memory device 100 reads the data of the refresh target page in the refresh target bank to the sense amplifier 25.

In step S220, the semiconductor memory device 100 reads the data corresponding to the bank address and the column address, which is the data of the error correction target memory cell among the data read to the sense amplifier 25 of the error correction target bank, from the sense amplifier 25 to the error correction unit 50.

In step S230, the error correction unit 50 corrects the data read by the error correction unit 50. In this embodiment, error correction is performed using a Huffman code as described above.

In step S240, the error correction unit 50 writes back data from the error correction unit 50 to the sense amplifier 25 of the error correction target bank.

In step S250, the semiconductor memory device 100 writes back data from the sense amplifier 25 of the refresh target bank to the refresh target page. After that, the refresh and error correction process ends.

Figure 3:
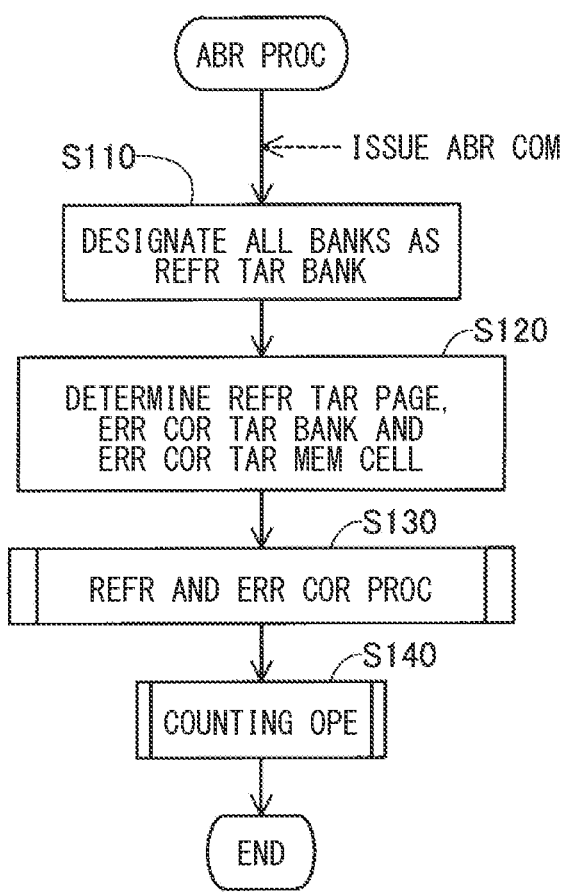
FIG. 3 is a flowchart showing an ABR process.

As shown in FIG. 3, in the ABR process, the counter 60 performs a predetermined counting operation each time an ABR command is issued (at step S140). More specifically, in the present embodiment, the counter 60 performs a counting operation after the refresh and error correction process is completed. This counting operation will be described with reference to FIG. 5.

Figure 5:
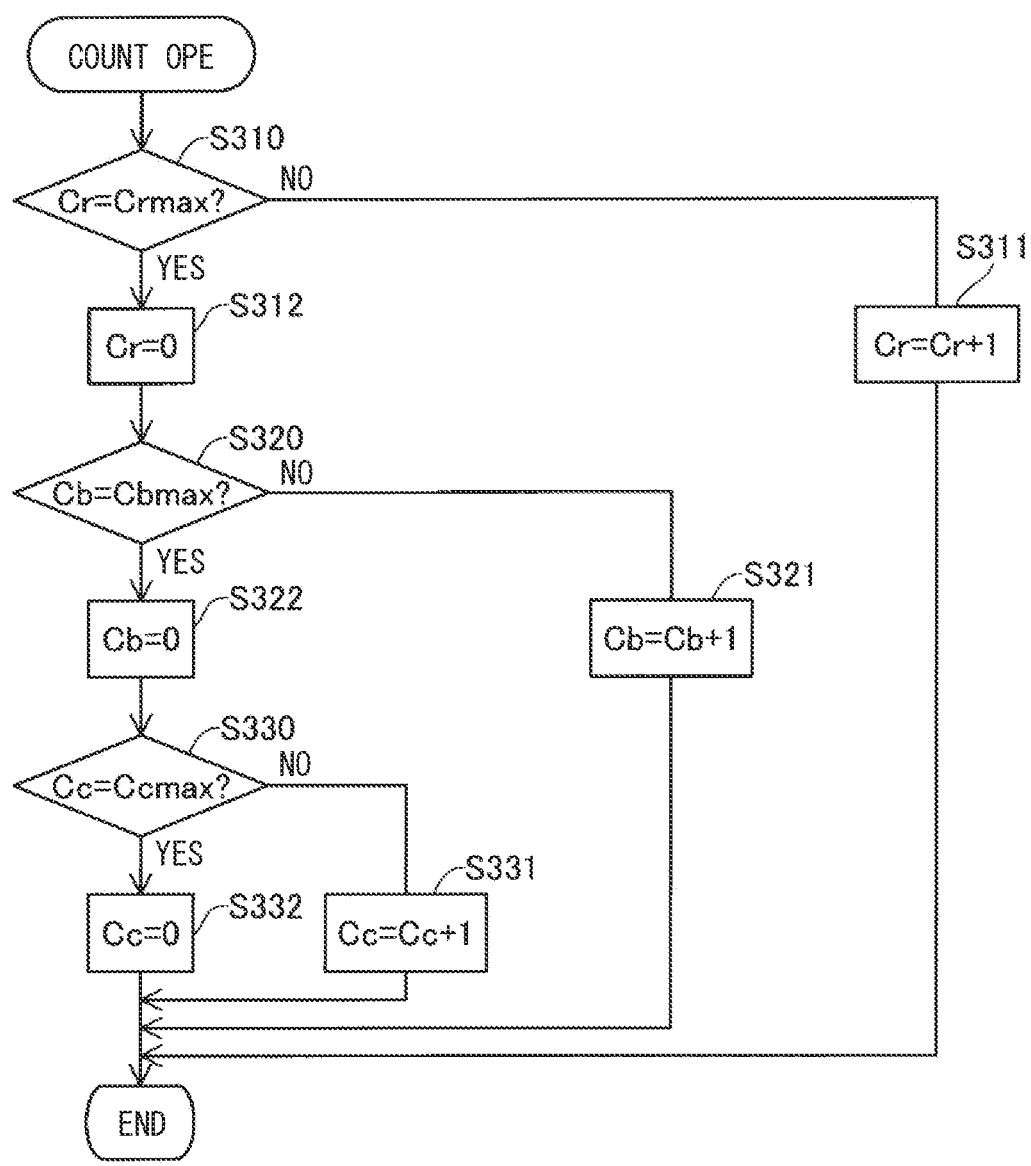
FIG. 5 is a flowchart showing a counting operation.

As shown in FIG. 5, when the row counter value Cr is smaller than the row counter maximum value Crmax in step S310, the row counter 61 increments the row counter value Cr by 1 (at step S311), and the counting operation ends.

When the row counter value Cr is equal to the row counter maximum value Crmax in step S310, the row counter 61 resets the row counter value Cr to be 0 (at step S312).

When the bank counter value Cb is smaller than the bank counter maximum value Cbmax in step S320, the bank counter 63 increments the bank counter value Cb by 1 (at step S321), and the counting operation ends. In other words, the bank counter 63 increments the bank counter value Cb by 1 each time the row counter value Cr is reset from the row counter maximum value Crmax to 0. More specifically, in the present embodiment, the bank counter 63 increments the bank counter value Cb by 1 at the same time when the row counter value Cr is reset from the row counter maximum value Crmax to 0.

When the bank counter value Cb is equal to the bank counter maximum value Cbmax in step S320, the bank counter 63 resets the bank counter value Cb to 0 (at step S322).

When the column counter value Cc is smaller than the column counter maximum value Ccmax in step S330, the column counter 62 increments the column counter value Cc by 1 (at step S331), and the counting operation ends. In other words, the column counter 62 increments the column counter value Cc by 1 each time the bank counter value Cb is reset from the bank counter maximum value Cbmax to 0. More specifically, in the present embodiment, the column counter 62 increments the column counter value Cc by 1 at the same time that the bank counter value Cb is reset from the bank counter maximum value Cbmax to 0.

When the column counter value Cc is equal to the column counter maximum value Ccmax in step S330, the column counter 62 resets the column counter value Cc to 0 (at step S332). After that, the counting operation ends.

As described above, by performing the ABR process once, the data recorded on the refresh target page can be refreshed and the error correction process can be performed on the data recorded in the error correction target memory cell. Further, in response to the ABR commands issued one after another from the external device, the ABR process is repeatedly performed until all the counters 60 have cycled, so that the refresh and error correction process is performed on all the data recorded in the data storage unit 20.

The PBR process shown in FIG. 6 will be described. The PBR process is a process of performing the refresh and error correction process on a designated one or a plurality of banks among a plurality of banks 10. In the present embodiment, the semiconductor memory device 100 executes the PBR process when it receives an PBR command issued from an external device. The PBR command corresponds to the "second refresh command" in the present embodiment.

In the PBR process, the bank specified by the PBR command is designated as the refresh target bank and the error correction target bank. In step S410, the bank B0 is designated as a refresh target bank and an error correction target bank.

In step S420, the semiconductor memory device 100 determines the refresh target page and the error correction target memory cell based on the row counter value Cr and the column counter value Cc at the time of issuing the PBR command. The time when the PBR command is issued may not be limited to the time when the PBR command is issued, but also includes, for example, the timing when the semiconductor memory device 100 receives the PBR command.

In step S430, the semiconductor memory device 100 performs the refresh and error correction process. The refresh and error correction process in this step is the same as the refresh and error correction process in the ABR process described above.

Figure 6:
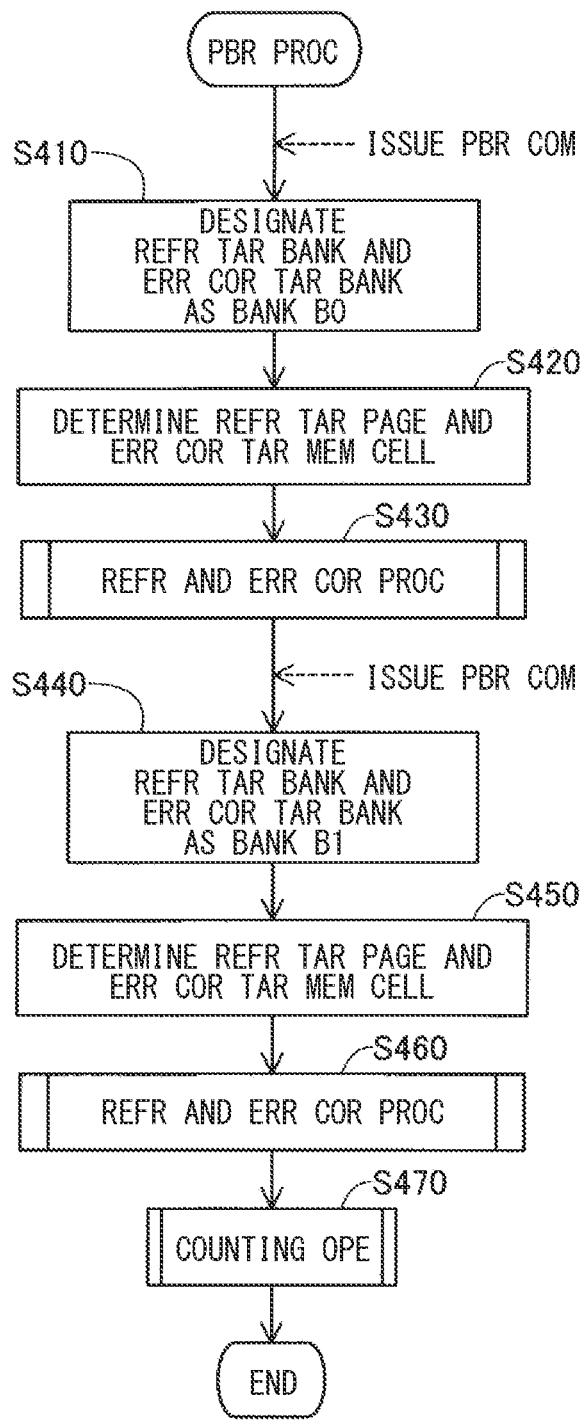
FIG. 6 is a flowchart showing an PBR process.
Figure 7:
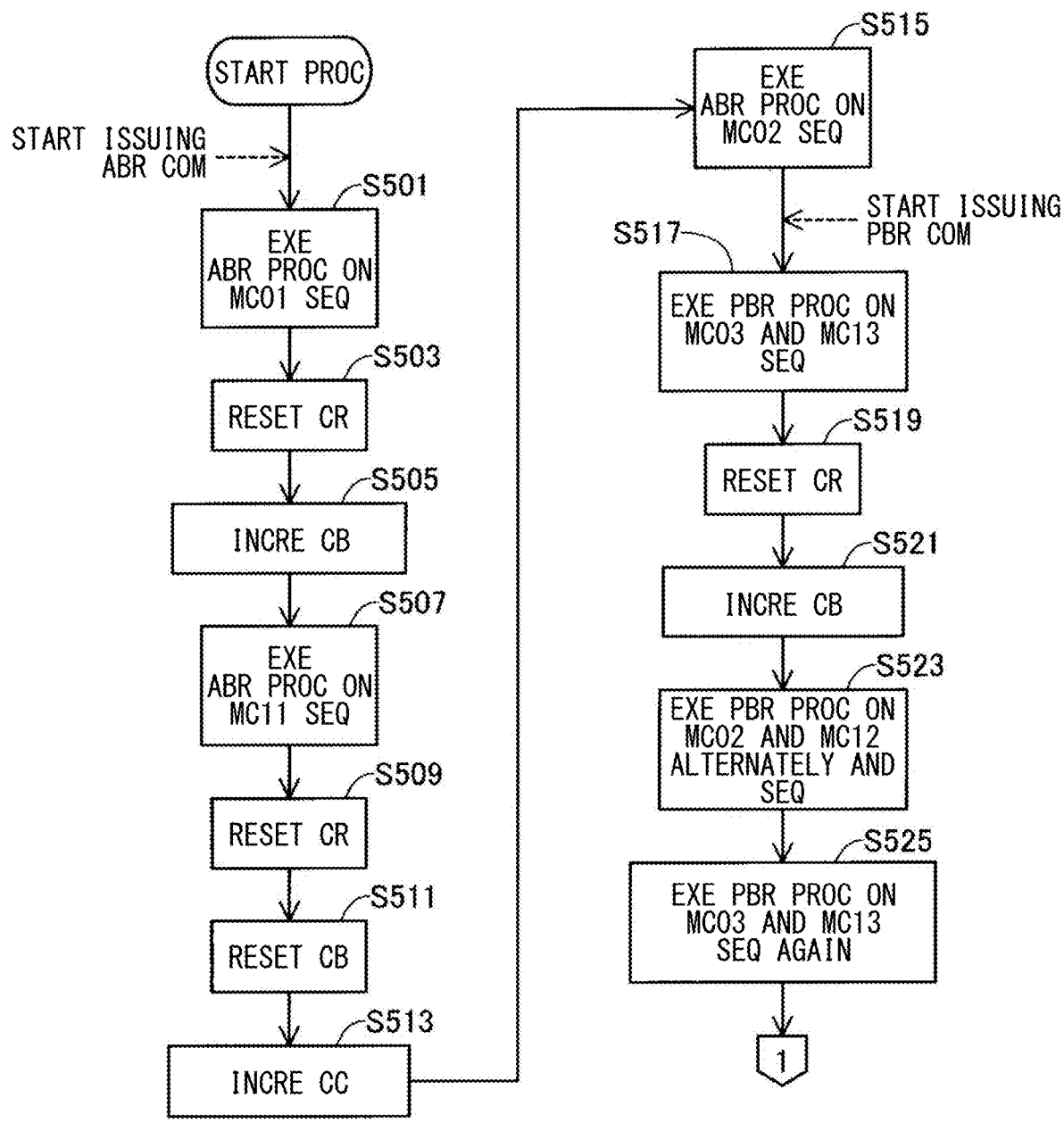
FIG. 7 is an explanatory diagram showing a first half portion of a process in which the ABR process and the PBR process are alternately performed.
Figure 8:
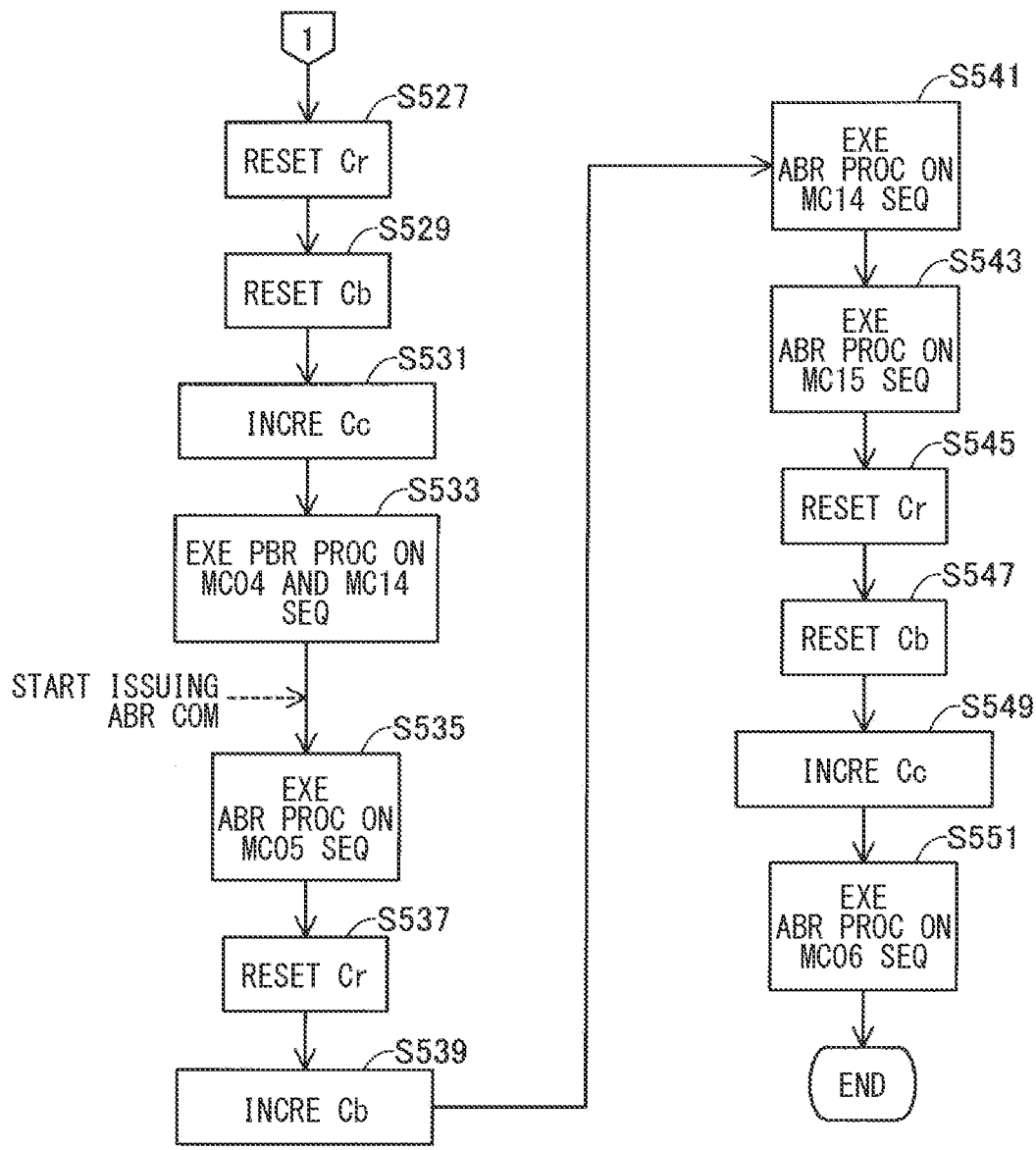
FIG. 8 is an explanatory diagram showing a latter half of a process in which the ABR process and the PBR process are alternately performed.

After the refresh and error correction process for the bank B0, in the example of FIG. 6, the semiconductor memory device 100 receives the PBR command issued from the external device again. In this case, similarly to step S410, the bank designated by the PBR command is designated as the refresh target bank and the error correction target bank. In step S440, the bank B1 is designated as a refresh target bank and an error correction target bank.

In step S450, the semiconductor memory device 100 determines the refresh target page and the error correction target memory cell in the same manner as in step S420.

In step S460, the semiconductor memory device 100 performs the refresh and error correction process. The refresh and error correction process in this step is the same as the refresh and error correction process in the ABR process described above.

As shown in FIG. 6, in the PBR process, the counter 60 performs a predetermined counting operation for each issuance of the PBR command to all the designated banks (at step S470). More specifically, in the present embodiment, the counter 60 performs a counting operation after the refresh and error correction process for all the designated banks is completed. The counting operation in the PBR processing is the same as the counting operation in the ABR processing, but the bank counter value Cb is not used in the determination of the error correction target address in the PBR process.

As described above, by performing the PBR process once, the data recorded on the refresh target page of the designated bank can be refreshed and the error correction process can be performed on the data recorded in the error correction target memory cell. Further, by repeatedly executing the PBR process until the row counter 61 and the column counter 62 make a round in response to the PBR commands issued one after another from the external device, the refresh and error correction process is performed on all the data in the data storage unit 20.

An example of the process when the PBR command is issued during the execution of the ABR process and the case where the ABR command is issued during the execution of the PBR process will be described with reference to FIGS. 7, 8 and 9A to 9D. It should be noted that although there are steps for resetting and incrementing in FIGS. 7 and 8, these steps are merely represented by extracting the operation when any one of the counters 60 makes a round for the sake of explanation. It is not a counting operation performed in addition to the counting operation performed in the ABR process or the PBR process.

Figure 9A:
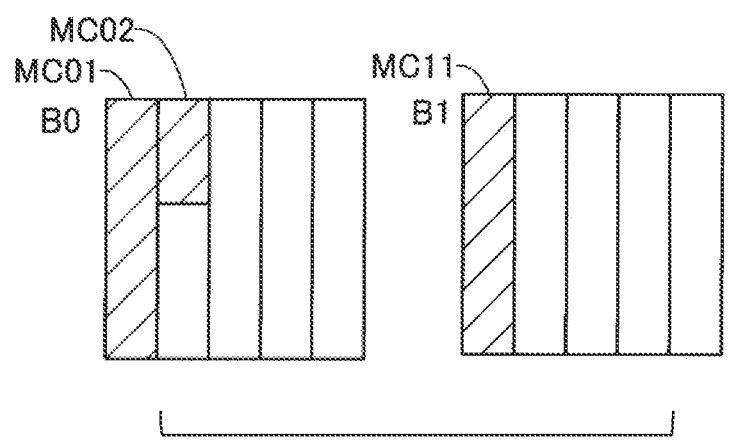
FIG. 9A is an explanatory diagram showing an error-corrected area after the end of step S515 of FIG. 7.

In step S501, the semiconductor memory device 100 performs the ABR process on the region MC01 of FIG. 9A. When the process up to the final row address of the region MC01 is completed, the row counter 61 resets the row counter value Cr (at step S503), and the bank counter 63 increments the bank counter value Cb (at step S505).

In step S507, the semiconductor memory device 100 performs the ABR process on the region MC11. When the ABR process is completed up to the final row address of the region MC11, the row counter 61 resets the row counter value Cr (at step S509), and the bank counter value Cb is equal to 1, which is the bank counter maximum value Cbmax, so that the bank counter 63 resets the bank counter value Cb (at step S511). Further, since the bank counter value Cb is reset from the bank counter maximum value Cbmax to 0, the column counter 62 increments the column counter value Cc (at step S513).

In step S515, the ABR process is performed on the region MC02, but in the example of FIG. 9A, the issuance of the PBR command is started before the final row address of the bank B0 is reached. The bank B0 and bank B1 are specified in the PBR command in this process.

FIG. 9A shows an error-corrected area at the end of step S515. The hatched area of FIG. 9A represents an area in which the error correction process is performed once.

Figure 9B:
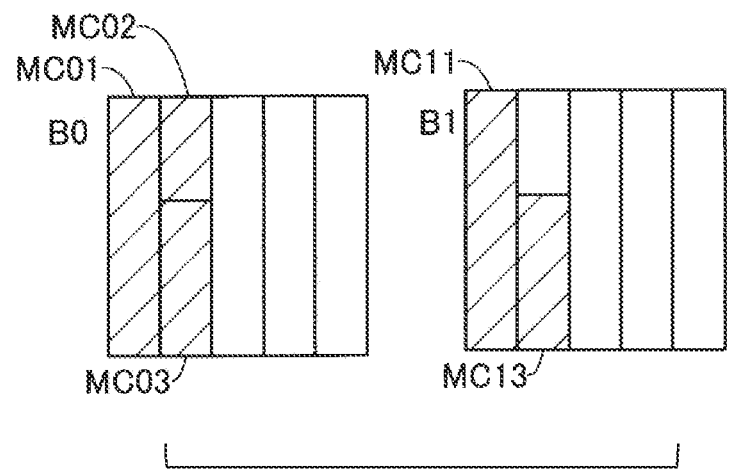
FIG. 9B is an explanatory diagram showing an error-corrected area after the end of step S517 of FIG. 7.

In step S517, the semiconductor memory device 100 performs PBR processing on the region MC03 and the region MC13 of FIG. 9B. The PBR process is performed on the region MC03 and the region MC13 alternately.

FIG. 9B shows an error-corrected area at the end of step S517.

The process in steps S519 and S521 performed after the PBR process for the memory cell 22 at the final row address of the region MC13 is the same as the process in steps S503 and S505. In step S521, the bank counter 63 increments the bank counter value Cb, but the column counter value Cc does not change because the change is from 0 to 1.

In step S523, since the refresh target column does not change from step S517, the semiconductor memory device 100 performs the PBR process on the area MC02 and the area MC12. Although the ABR process has already been performed on the area MC02, there is no problem even if the error correction process is performed again on the same area.

In step S525, the semiconductor memory device 100 performs PBR processing on the region MC03 and the region MC13 again. The processing in steps S527 to S531 shown in FIG. 8 after the PBR process for the memory cell 22 at the final row address of the region MC13 is the same as the process in steps S509 to S513 shown in FIG. 7.

Figure 9C:
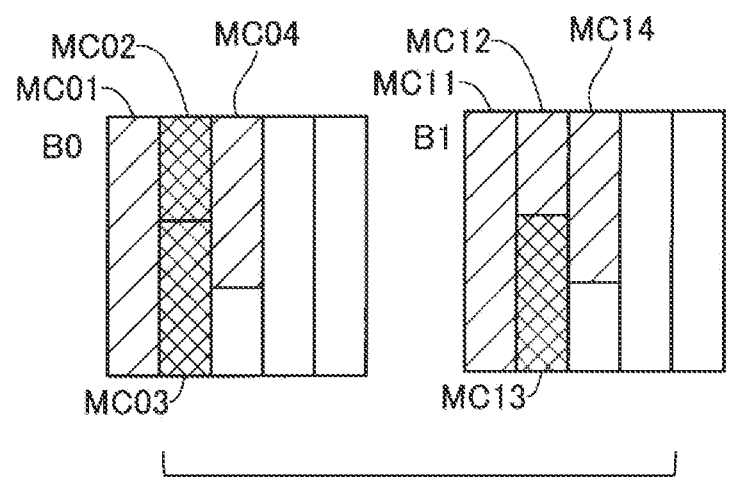
FIG. 9C is an explanatory diagram showing an error-corrected area after the end of step S533 of FIG. 8.

In step S533, the semiconductor memory device 100 performs the PBR processing on the area MC04 and the area MC14 of FIG. 9C, but in the example of FIG. 9C, the issuance of the ABR command is started before the final row address of the bank B1 is reached.

FIG. 9C shows an error-corrected area at the end of step S533. The area with cross-hatching in FIG. 9C represents an area where the error correction has been performed twice.

Figure 9D:
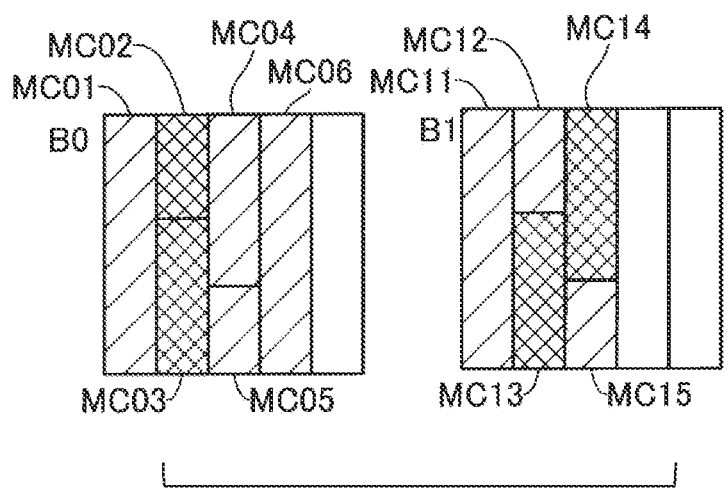
FIG. 9D is an explanatory diagram showing an error-corrected area after the end of step S551 of FIG. 8.

In step S535, the semiconductor memory device 100 performs the ABR process on the region MC05 of FIG. 9D. The process in steps S537 and S539 performed after the ABR process for the memory cell 22 at the final row address of the region MC05 is the same as the process in steps S503 and S505 shown in FIG. 7.

In step S541, the semiconductor memory device 100 performs the ABR process on the region MC14. Since the PBR process has already been performed on the region MC14, the ABR process performed in this step is the second error correction. Subsequently, the semiconductor memory device 100 performs the ABR process on the region MC15 (at step S543). The processing in steps S545 to S549 after the ABR process for the memory cell 22 at the final row address of the region MC15 is the same as the process in steps S509 to S513 shown in FIG. 7.

When the ABR process for the area MC06 is completed in step S551, the ABR command and the PBR command are not issued from the external device, and this process is terminated. FIG. 9D shows an area where the error correction process is completed after the end of this process. As shown in FIG. 9D, even if the ABR process and the PBR process are alternately performed, the refresh and error correction process can be performed without omission while the refresh command is issued. If the ABR command is continuously issued after step S551, the refresh and error correction process can be performed on all the data recorded in the data storage unit 20.

According to the semiconductor memory device 100 of the embodiment described above, even in the semiconductor memory device 100 including the plurality of banks 10, the error correction process can be performed at the time of refreshing for all the data recorded in the data storage unit 20. Therefore, it is possible to suppress a decrease in data reliability in the semiconductor memory device 100 including the plurality of banks 10. In addition, even if the ABR process and the PBR process are alternately performed, the refresh and error correction process can be performed on all the data without omission, so that the deterioration of the reliability of the data can be suppressed.

B. Other Embodiments (B1) In the above embodiment, the plurality of banks 10 included in the semiconductor memory device 100 are bank B0 and bank B1, but the present embodiment may not be limited thereto. The number of the plurality of banks 10 may be more than 2.

(B2) In the above embodiment, the row counter 61, the column counter 62, and the bank counter 63 increment the counter value, but the present embodiment may not be limited thereto. For example, the row counter 61, the column counter 62, and the bank counter 63 may decrement the counter value.

(B3) In the above embodiment, the counting operation of the counter 60 is performed after the refresh and error correction process is completed, but the present embodiment may not be limited to this feature. For example, the counting operation of the counter 60 may be performed after the refresh command is issued or after the correction data is written back.

(B4) In the above embodiment, the bank counter 63 increments the bank counter value Cb by 1 at the same time when the row counter value Cr is reset from the row counter maximum value Crmax to 0, but the present embodiment may not be limited to this feature. For example, the bank counter 63 may increment the bank counter value Cb by 1 after the row counter value Cr is reset from the row counter maximum value Crmax to 0.

(B5) In the above embodiment, the column counter 62 increments the column counter value Cc by 1 at the same time when the bank counter value Cb is reset from the bank counter maximum value Cbmax to 0, but the present embodiment may not be limited to this feature. For example, the column counter 62 may increment the column counter value Cc by 1 after the bank counter value Cb is reset from the bank counter maximum value Cbmax to 0.

The present disclosure should not be limited to the embodiments described above, and various other embodiments may be implemented without departing from the scope of the present disclosure. For example, the technical features in each embodiment corresponding to the technical features in the form described in the summary may be used to solve some or all of the above-described problems, or to provide one of the above-described effects. In order to achieve a part or all, replacement or combination can be appropriately performed. Also, some of the technical features may be omitted as appropriate.

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

It is noted that a flowchart or the processing of the flowchart in the present application includes sections (also referred to as steps), each of which is represented, for instance, as S110. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor memory device having a refresh function, the semiconductor memory device comprising:
    a plurality of banks having a data storage unit that stores data and an error correction code storage unit that stores an error correction code corresponding to the data stored in the data storage unit;
    an error correction code generation unit that generates an error correction code;
    an error correction unit that performs an error correction process of data using the error correction code;
    a row counter that determines a row address as a refresh target;
    a bank counter that determines a bank address as an error correction target; and
    a column counter that determines a column address as the error correction target, wherein:
    the error correction unit performs the error correction process on data of an error correction target address determined based on the row counter, the bank counter, and the column counter when receiving a refresh command.

2. The semiconductor memory device according to claim 1, wherein:
    when receiving a first refresh command for instructing refresh for all banks among the plurality of banks as the refresh command, the row counter performs a counting operation every time the first refresh command is issued; when receiving a second refresh command for instructing refresh for a specified bank among the plurality of banks as the refresh command, the row counter performs the counting operation for all the specified bank every time the second refresh command is issued;
    the bank counter performs a counting operation every time the row counter makes a round; and
    the column counter performs a counting operation every time the bank counter makes a round.

3. The semiconductor memory device according to claim 1, further comprising:
    one or more processors; and
    a memory coupled to the one or more processors and storing program instructions that when executed by the one or more processors cause the one or more processors to provide at least: the plurality of banks; the error correction code generation unit; the error correction unit; the row counter; the bank counter; and the column counter, wherein:
    the processor provides signals to the plurality of banks, the error correction code generation unit, the error correction unit, the row counter, the bank counter, and the column counter.

* * * * *